(12) United States Patent
Baseman et al.

(10) Patent No.: US 9,240,360 B2
(45) Date of Patent: Jan. 19, 2016

(54) RUN-TO-RUN CONTROL UTILIZING VIRTUAL METROLOGY IN SEMICONDUCTOR MANUFACTURING

(75) Inventors: Robert Jeffrey Baseman, Brewster, NY (US); Jingrui He, Yorktown Heights, NY (US); Emmanuel Yashchin, Yorktown Heights, NY (US); Yada Zhu, White Plains, NY (US)

(73) Assignee: International Business Machines Corporation, Armonk, NY (US)

(*) Notice: Subject to any disclaimer, the term of this patent is extended or adjusted under 35 U.S.C. 154(b) by 482 days.

(21) Appl. No.: 13/557,955

(22) Filed: Jul. 25, 2012

(65) Prior Publication Data

US 2014/0031968 A1   Jan. 30, 2014

(51) Int. Cl.
*G06F 19/00* (2011.01)
*H01L 21/66* (2006.01)
*G05B 13/04* (2006.01)
*G05B 19/418* (2006.01)

(52) U.S. Cl.
CPC .............. *H01L 22/20* (2013.01); *G05B 13/048* (2013.01); *G05B 19/41875* (2013.01); *G05B 2219/32182* (2013.01); *G05B 2219/32187* (2013.01); *G05B 2219/32194* (2013.01); *G05B 2219/45031* (2013.01)

(58) Field of Classification Search
CPC .............. G05B 13/024; G05B 13/048; H01L 21/67253
USPC ............................................. 700/121; 702/57
See application file for complete search history.

(56) References Cited

U.S. PATENT DOCUMENTS

| | | | |
|---|---|---|---|
| 6,829,056 B1 * | 12/2004 | Barnes et al. ................. | 356/625 |
| 6,917,849 B1 * | 7/2005 | Pasadyn et al. ............... | 700/121 |
| 7,517,708 B2 * | 4/2009 | Deshpande et al. ........... | 438/18 |
| 7,587,704 B2 | 9/2009 | Ye | |
| 7,751,046 B2 * | 7/2010 | Levy et al. .................... | 356/401 |
| 7,840,298 B2 * | 11/2010 | Malig et al. ................... | 700/109 |
| 8,139,843 B2 | 3/2012 | Kulkarni et al. | |
| 8,224,475 B2 * | 7/2012 | Tsai et al. ..................... | 700/121 |
| 2010/0060888 A1 | 3/2010 | Reich et al. | |

* cited by examiner

*Primary Examiner* — Michael D Masinick
(74) *Attorney, Agent, or Firm* — Daniel P. Morris, Esq.; Otterstedt, Ellenbogen & Kammer, LLP

(57) ABSTRACT

A method for run-to-run control and sampling optimization in a semiconductor manufacturing process includes the steps of: determining a process output and corresponding metrology error associated with an actual metrology for a current processing run in the semiconductor manufacturing process; determining a predicted process output and corresponding prediction error associated with a virtual metrology for the current processing run; and controlling at least one parameter corresponding to a subsequent processing run as a function of the metrology error and the prediction error.

17 Claims, 7 Drawing Sheets

RUN-TO-RUN CONTROL UTILIZING VIRTUAL METROLOGY IN SEMICONDUCTOR MANUFACTURING

FIELD OF THE INVENTION

The present invention relates generally to the electrical, electronic, and computer arts, and more particularly relates to semiconductor manufacturing.

BACKGROUND

Virtual metrology (VM) generally refers to a model-based prediction of some process outcome in place of, or in the absence of, an actual physical measurement of that outcome. The underlying models are learned from histories of the actual physical outcomes and predictors that may include process trace data, tool consumable status, and incoming work characteristics, among other factors. If the models are sufficiently accurate predictors of process outcomes, VM applications present an opportunity to reduce the number of physical measurements made to monitor a given process, while maintaining or even improving quality control. Such applications are especially attractive for highly complex, capital-intensive semiconductor manufacturing lines in which measurements monitoring processes may add significant processing time and cost.

SUMMARY

Embodiments of the invention provide methods and apparatus for improving run-to-run (R2R) control in a semiconductor manufacturing process in a manner which is beneficially adapted to account for process drift. The R2R control methodology according to aspects of the invention is based on processing time which can avoid dealing with high dimensional process variables, which typically have intricate dependencies among one another, and effectively reduce the process variation. The R2R control techniques according to embodiments of the invention further provide a means for optimizing semiconductor wafer inspection policy.

In accordance with an embodiment of the invention, a method for run-to-run control and sampling optimization in a semiconductor manufacturing process includes the steps of: determining a process output and corresponding metrology error associated with an actual metrology for a current processing run in the semiconductor manufacturing process; determining a predicted process output and corresponding prediction error associated with a virtual metrology for the current processing run; and controlling at least one parameter corresponding to a subsequent processing run as a function of the metrology error and the prediction error.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

Aspects of the present invention will be described herein in the context of illustrative methods and apparatus for enhancing run-to-run (R2R) control using virtual metrology (VM) to reduce process variation in semiconductor manufacturing. It is to be appreciated, however, that the invention is not limited to the specific apparatus and/or methods illustratively shown and described herein. Moreover, it will become apparent to those skilled in the art given the teachings herein that numerous modifications can be made to the embodiments shown that are within the scope of the present invention. That is, no limitations with respect to the specific embodiments described herein are intended or should be inferred.

Figure 1:
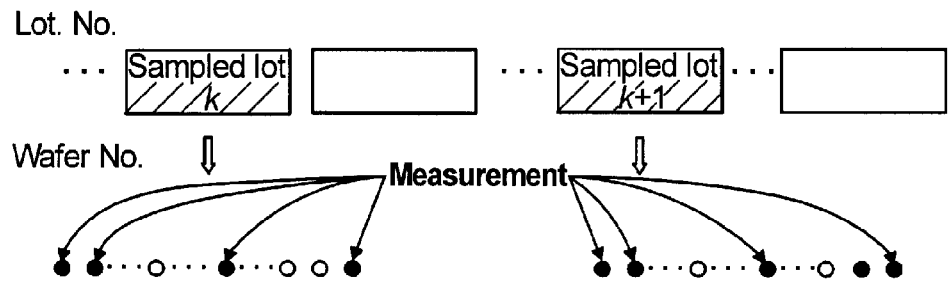
FIG. 1 is a block diagram conceptually depicting a method of sampling for metrology to monitor process performance during semiconductor manufacturing.

In semiconductor manufacturing, wafers go through hundreds of processes to finally yield integrated circuit devices. Each process generally follows a given recipe that defines detailed fabrication steps and settings of the process variables. FIG. 1 is a high-level block diagram which conceptually depicts sampling for metrology to monitor process performance during semiconductor manufacturing. As shown in FIG. 1, since the manufacturing process is quite complex, wafers in selected lots (e.g., lots k and k+1, where k is an integer) are sampled for metrology to monitor the process performance. Based on the metrology results, the process control system will take appropriate action to adjust one or more process parameters (e.g., exposure time, deposition rate, oxide growth rate, temperature, doping concentration, etc.) by lot or by wafer. However, this standard metrology and control scheme is based on an assumption that there is no abrupt process drift between measured wafers, which is often not the case. Moreover, due to metrology delay (e.g., up to three days for plasma etch process), there can be a large time gap for process control. To fill this information gap between measured wafers and the time gap in process control, timely wafer-by-wafer metrology is indispensable.

Modern semiconductor processing tools publish large amounts of real-time data which can, to some extent, reflect the actual processing conditions. Therefore, in recent years VM, which involves building models to predict wafer quality based on historical measurements and the corresponding process variables, has received a lot of attention in the semiconductor industry. The predicted wafer quality can then facilitate timely process control, detect faulty wafers early in the process, and improve productivity by reducing actual metrology frequency (i.e., sampling frequency).

For this purpose, statistical models based on one-dimensional vectors have been constructed, such as, for example, multiple regression with feature selection, partial least squares, support vector regression (SVR), and artificial neural networks. However, process data in semiconductor manufacturing usually come in the form of tensors, or multidimensional arrays. For example, in plasma deposition operations, each recipe process usually has multiple steps. During each step, process variables, such as, but not limited to, temperature, pressure and gas flow per unit time can be observed. Therefore, to predict the wafer quality, the input data are naturally expressed as third-order tensors—the three dimensions or modes being steps, time (e.g., seconds) within a step, and observed process variables, or features—or second-order tensors, if summary statistics are used for each process variable in a single step instead of instantaneous measurements.

Figure 2:
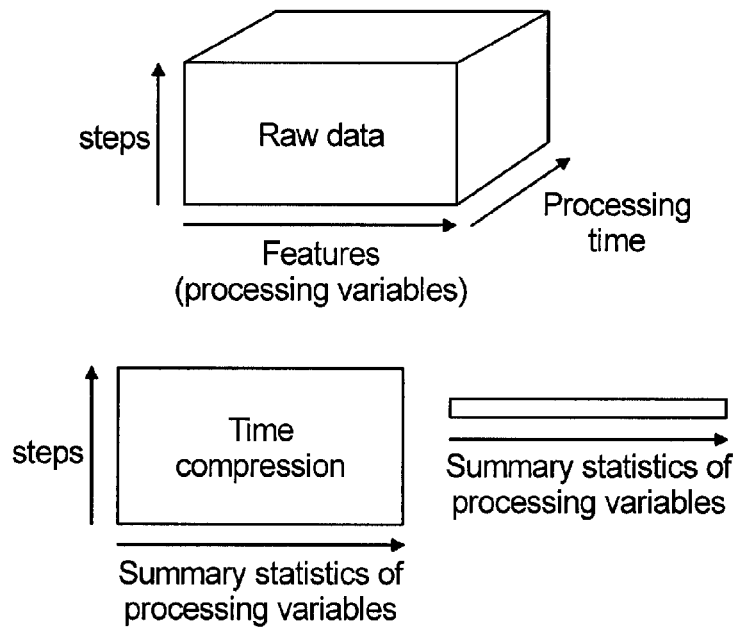
FIG. 2 conceptually depicts the conversion of tensors (embodying raw data) into one-dimensional vectors.

FIG. 2 conceptually depicts conversion of tensors (embodying raw data) into one-dimensional vectors. As a result of the process of converting tensors into vectors, however, significant information embedded in the structure of the tensors can be lost, such as, for instance, feature correspondence in different steps. Consequently, a prediction model which utilizes tensor inputs, rather than vectorized inputs, is preferred.

Since VM serves to predict every wafer's metrology values, it enables, among other things, R2R control at the wafer level (i.e., wafer-to-wafer control). Compared to a traditional lot-to-lot control scheme, wafer-to-wafer control schemes based on a combination of virtual and actual metrology values can potentially achieve a number of important benefits, such as, but not limited to, enhanced final yield, predictive equipment maintenance, and improved productivity. For this object, exponentially weighted moving average (EWMA) controllers and its variations are widely used to adjust the recipe parameters in existing work. However, for processes with severe drifts, an EWMA controller is insufficient even when large weights are used. This problem becomes more severe when there is a metrology delay, which is almost inevitable in semiconductor manufacturing. In addition, a typical recipe process can have hundreds of variables with intricate dependencies among each other. These issues present challenges for R2R control utilizing VM.

In accordance with embodiments of the invention, several VM embedded R2R control schemes are provided that are operative to facilitate feedback control based on combining actual and virtual metrology values. The R2R controllers are based on processing time, which can avoid dealing with high-dimensional process variables. An ability of the control schemes according to embodiments of the invention to effectively reduce process variation is demonstrated herein below based on experiment results. Embodiments of the invention preferably utilize a wafer quality prediction model for metrology variable prediction with tensor input process variables by directly operating on the tensor. Experimental results demonstrate improved performance of this model compared to standard approaches that deal with only one-dimensional inputs. A detailed discussion of tensor-based wafer quality prediction models that are suitable for use with embodiments of the invention are described in co-pending U.S. patent application Ser. No. 13/526,152 filed on Jun. 18, 2012, the disclosure of which is expressly incorporated by reference herein in its entirety for all purposes.

R2R control is a process control framework that adjusts process inputs on a run-by-run basis as a function of information obtained during and/or after the process, or prescribed stages of the process, have completed in order to improve productivity. The EWMA statistics and its variations are widely used as R2R controllers. In order to compromise the impact of process drift, a double EWMA (dEWMA) controller, modified EWMA, predictor-corrector controller and a Bayesian enhanced EWMA controller are developed, according to embodiments of the invention. These controllers are operative to adjust one or more recipe settings associated with the process so the process, or parameters thereof, can be brought to within prescribed target specifications. However, a recipe process may have hundreds of process variables, with at least a subset of the variables having complex interrelationships. It has been shown that one of the most effective manipulated variables in R2R control is processing time, such as, for example, etch time, exposure time and/or planarization time. (See, e.g., S. J. Qin, et al., "Semiconductor manufacturing process control and monitoring: A fab-wide framework," Journal of Process Control, 16(3): 179-191, 2006, the disclosure of which is incorporated herein by reference in its entirety.)

Suppose the process output can be described as $$y_n = \bar{r}_n t_n, \quad (1)$$

where $t_n$ and $\bar{r}_n$ represent processing time and average processing rate, respectively, for a given run n. Based on this relationship, three VM embedded control schemes are presented, according to embodiments of the invention, although it is to be understood that the invention is not limited to the control schemes described herein. These control schemes are not only able to quickly adapt to process drifts, but they also lead to larger reduction in process variation compared to what can be achieved by actual metrology alone.

As will be described in further detail below, a tensor-based model for wafer quality prediction is constructed which can incorporate prior knowledge from various sources in a principled way. First, certain notation used throughout the description will be presented; then, an objective function will be described; and finally, performance of the model on real production data sets will be demonstrated.

Assume there are N training examples $\{\mathcal{X}_n, y_n\}$, n=1, ..., N, where $\mathcal{X}_n \in \mathbb{R}^{d_1 \times d_2 \times \cdots \times d_K}$ is a K-dimensional array, or $K^{th}$-order tensor, and $y_n \in \mathbb{R}$ is the response variable. Notice that for $\mathcal{X}_n$, K is the dimension of this array of the number of modes of this tensor, and $d_K$ is the number of elements along the $k^{th}$ dimension, k=1, ..., K. Therefore, the total number of input features is $\Pi_{k=1}^{K} d_k$. When K=1, the input $\mathcal{X}_n$ is a vector, and the problem is reduced to regular regression; when K=2, $\mathcal{X}_n$ is a matrix; when K>2, $\mathcal{X}_n$ is a $K^{th}$-order tensor. For the present discussion, we focus on cases where K>1.

Let $\mathcal{T}_1, \mathcal{T}_2 \in \mathbb{R}^{d_1 \times d_2 \times \cdots \times d_K}$ denote two tensors. Define $\langle \mathcal{T}_1, \mathcal{T}_2 \rangle$ to be the inner products of their corresponding elements. Furthermore, define the norm of tensor $\|\mathcal{T}_1\| = \sqrt{\langle \mathcal{T}_1, \mathcal{T}_2 \rangle}$. The value of $y_n$ is predicted using a linear model, thus we have a weight tensor $\mathcal{C} \in \mathbb{R}^{d_1 \times d_2 \times \cdots \times d_K}$ which is the same size as $\mathcal{X}_n$. We first approximate the weight tensor using a rank-one tensor whose Candecomp/Parafac (CP) decomposition is, in turn, approximated based on prior information.

More particularly, we minimize a loss function $L(y_n, \langle \mathcal{X}_n, \mathcal{C} \rangle)$ summed over all training examples. Here, we require that $L(\cdot,\cdot)$ is the squared loss and convex with respect to the second argument. Based on the tensor structure, it is assumed that the weight tensor $\mathcal{C}$ can be approximated by a rank-one tensor with CP decomposition $a_1 \circ a_2 \circ \ldots \circ a_K$, where $a_k \in \mathbb{R}^{d_K}$ is the weight vector for the $k^{th}$ mode. $a_k$ reflects the general importance of the $k^{th}$ mode of the input tensors. In other words, $\|\mathcal{C} - a_1 \circ a_2 \circ \ldots \circ a_K\|^2$ should be small. Intuitively, $a_k$ measures the contribution of the $k^{th}$ mode $\mathcal{X}$ to the output $y_n$.

For example, when K=2, $\mathcal{C}$ is a matrix, and $\mathcal{C}(i,j)$ should be close to $a_1(i) \times a_2(j)$, where $\mathcal{C}(i,j)$ is the element of $\mathcal{C}$ in the $i^{th}$ row and $j^{th}$ column, $a_1(i)$ is the $i^{th}$ element of $a_1$, and $a_2(j)$ is the $j^{th}$ element of $a_2$. Furthermore, for each $a_k$, it is assumed that it is close to vector $a_k \in \mathbb{R}^{d_k}$, which is known a priori and reflects the domain knowledge. Putting everything together, the following objective function is obtained:

$$\min f(\mathcal{C}, a_1, \ldots, a_K) = \sum_{n=1}^{N} L(y_n, \langle \mathcal{X}_n, \mathcal{C} \rangle) + \gamma_0 \|\mathcal{C} - a_1 \circ a_2 \circ \ldots \circ a_K\|^2 + \sum_{k=1}^{K} \gamma_k \|a_k - a_{k0}\|^2, \quad (2)$$

where $\gamma_0, \gamma_1, \ldots, \gamma_K$ are positive parameters that balance among different terms. In particular, the relative values of $\gamma_0, \ldots, \gamma_K$ reflect a confidence in using prior knowledge to approximate the weight vector in each mode: the bigger the value, the more confidence there is in this approximation. The weight tensor $\mathcal{C}$ in the objective function can be calculated using a block coordinate decent (BCD), which is guaranteed to converge to a local optimum since the objection function has a unique minimum in each coordinate block.

A global model across one or more chambers can be expressed as:

$$\min f(\beta_1, K\beta_T) = \sum_{c=1}^{T} \|Y_c - X_c \beta_c\|^2 + \lambda_1 \|\beta_c - \beta_0\|^2, \quad (3)$$

where $Y_c \in i^n$ denotes the quality of wafers from chamber c, and $X_c \in i^{n_c \times d}$ denotes the input process variables of chamber c. $\beta_c \in i^d$ are coefficient vectors and $\lambda_1$ is a positive parameter that encourages all the $\beta_c$ to be closed to the common vector $\beta_0 \in i^d$. $\beta_0$ reflects the chamber matching.

In accordance with an embodiment of the invention, exemplary steps for generating the global model include: approximating coefficients corresponding to different chambers to a common vector given by prior information on tool capability matching; adding a positive coefficient to balance different terms (i.e., adding regularization to prevent model over-fit); and minimizing the prediction error and optimizing the approximation, for example using a block coordinate based algorithm.

A metrology-based prediction model can be expressed as:

$$\hat{y}_i = y_j, \quad (4)$$

where j is the wafer index of the last measured wafer prior to time i. The value of $\hat{y}_i$ can then be used as a component of a more general predictor. This component will be included with a weight $w_i$ that is determined by $$w_i = \gamma P(i-j), \quad (4A)$$

where $\gamma$ is a positive coefficient and P is the function that determines an inverse of the variance of the predictor based on $\hat{y}_i$ as a function of i−j; i.e., the number of wafers since the last measured wafer.

A metrology and error-adaptive prediction model can be expressed as:

$$\hat{y}_i = \gamma(\epsilon) y_j + \beta^T X_i, \quad (5)$$

where $\hat{y}_i$ is defined as above, $y_j$ is the quality of the last measured wafer, $X_i$ is the input process variable, and $\beta^T$ denotes a vector of coefficients. The quantity $\gamma(\epsilon)$ is a function of the metrology or prediction bias or variation. A special case of this model is $$\hat{y}_i = \gamma y_j + \beta^T X_i, \quad (6)$$

Experimental Results: Case Study

By way of illustration only, a case study is presented in which the performance of the prediction model is compared with those models utilizing vectorized inputs. Data is collected from an exemplary plasma deposition process. A key measure of wafer quality is the deposition thickness. Each complete deposition process is comprised of multiple steps. Processing conditions (e.g., gas flows, temperatures, plasma properties, etc.) and step durations vary significantly from step to step. Process variables, such as, for example, gases and power, can take on different values at different steps. Thus, the data can be represented as a third-order tensor. In this study, summary statistics of median for each variable are used. The first exemplary process includes a total of 12 process variables. There are a total of 488 target measurements and associated process variables collected for the process. The process variables and the outputs are normalized to have mean zero and standard deviation one. This process is run on 8 different chambers, each with its own capability. The performance of five different exemplary models is compared. The five illustrative models are:

i. RR (ridge regression) model for dealing with vectorized inputs, which has been widely used as a baseline prediction model in VM applications for its simplicity and interpretability;

ii. SVR model with radical basis function (RBF) kernel for dealing with vectorized inputs;

iii. PLS (partial least square) regression model, which has been widely used in chemical and process industry;

iv. H-MOTE model—Equation (2), with $\alpha_{k0}$ given by the domain expert;

v. GM (global model)—Equation (3) with $\beta_0$ given by the domain expert.

Figure 3:
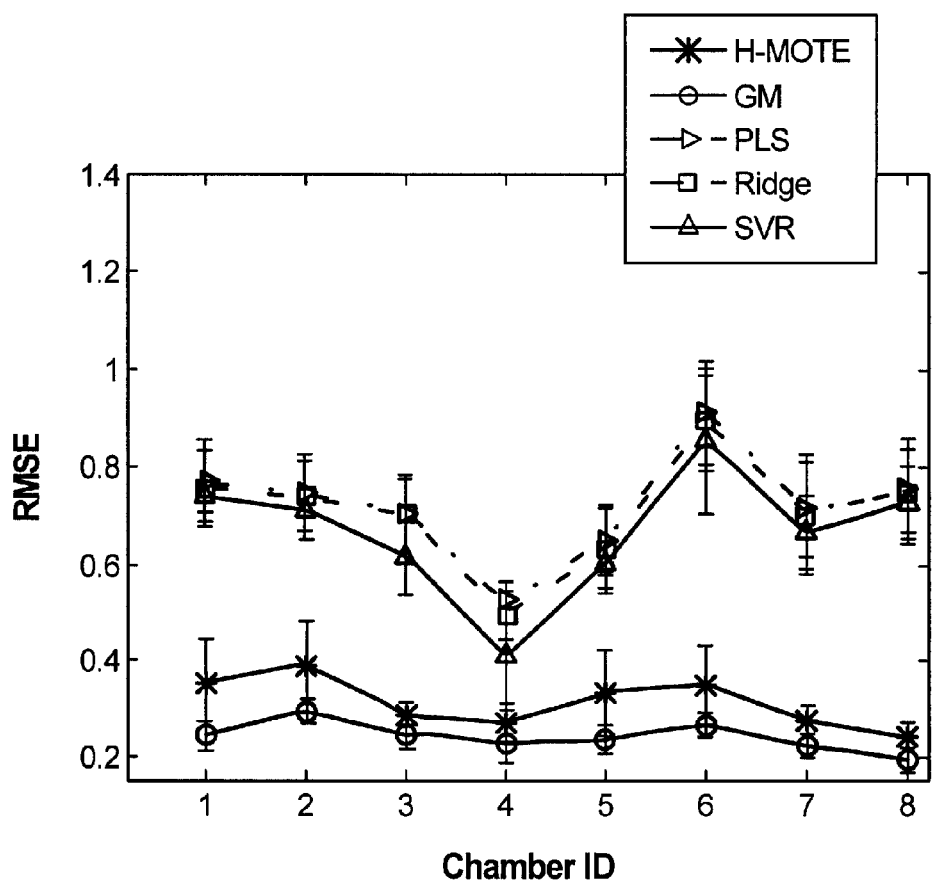
FIG. 3 graphically depicts a comparison of root mean square error (RMSE) versus chamber identifier (ID) for five different prediction models.

For all of the above models, parameters are chosen based on cross-validation in the training set only, and the cross-validation results of Root Mean Squared Error (RMSE) are used for comparison, as shown in FIG. 3. In this figure, the x-axis indicates the chamber ID, and the y-axis indicates average RMSE. For the given data set, we randomly choose 80% for training and the remaining 20% as the test set. The experiments were run 50 times, and both the mean and the variance were reported. As apparent from FIG. 3, the PLS model exhibits the highest RMSE, varying between about 0.6 and about 0.95 across all chambers; the GM model exhibits the lowest RMSE, varying between about 0.2 and about 0.3. The RR model exhibits slightly smaller RMSE than the PLS regression model. The SVR model is better than the RR and PLS regression models. The tensor-based method H-MOTE is better than the RR, PLS regression and SVR models, but worse than the global model GM in terms of the RMSE.

From FIG. 3, at least two observations can be made. First, the performance of H-MOTE is consistently better than PLS, RR and SVR models, which both take vectorized inputs. Second, the performance of GM outperforms the single chamber based model.

According to embodiments of the invention, three exemplary R2R control schemes are introduced based on processing time and their performance is evaluated based on three deposition processes. It is to be understood, however, that the invention is not limited to the exemplary R2R control schemes described herein, but that other R2R control schemes within the scope of the present invention are contemplated, as will become apparent to those skilled in the art given the teachings herein. Utilizing VM, the control system can obtain metrology values for each wafer, measured or not. Based on equation (1) above, the actual or virtual average processing rates can be estimated. This information can then be used in a given run n to control the process time in a subsequent run n+1. In the first R2R control scheme, $$t_{n+1} = \frac{T}{\widehat{\bar{r}_n}} \quad (3)$$

where T is the process target (e.g., deposition thickness) and $z,73$ is the predicted average process rate of run n based on equation (2). When the actual metrology value is available in run n, $\bar{r}_n$ is used instead. The process time $t_{n+1}$ for run n+1 is used in the next run of production. An effectiveness of the scheme varies with the accuracy of the rate prediction which is, in turn, based on the process variables and the VM model.

In the second R2R control scheme, $$t_{n+1} = \frac{T}{\alpha \bar{r}_{n,-1} + (1-\alpha) \widehat{\bar{r}_n}}, \quad (4)$$

$$0 \leq \alpha \leq 1$$

where $\bar{r}_{n,-1}$ is the average rate calculated based on the last actual metrology value, and $\alpha$ is a weight that can be chosen according to the VM error. Thus, when $\alpha=1$, the control scheme proposes the next processing time based on the last measurement alone. The performance of the control scheme depends on a strength of the process autocorrelation, and the frequency and availability of actual metrology. When $\alpha=0$, the control scheme reduces to the first R2R control scheme previously discussed. According to aspects of the invention, the R2R controller is operative to dynamically adjust the respective weights given to the actual metrology value and the virtual metrology value in a manner which optimizes a sampling policy of the process (e.g., sampling frequency).

In the third R2R control scheme, $$t_{n+1} = \frac{T}{\alpha(\varepsilon)\bar{r}_{n,-1} + [1-\alpha(\varepsilon)]\widehat{\bar{r}_n}} \quad (5)$$

where $\epsilon$ represents a number of factors related to prediction errors. The weight $\alpha(\cdot)$ can take on various forms, but its value must be constrained in the range [0, 1]. For example, we can use a quadratic function $$\alpha(\varepsilon) = \left[\frac{|\varepsilon_{-1}^T|}{\max(|\varepsilon_{-m}^T|)}\right]^2$$

in equation (5) above, where $\epsilon_{-1}^T$ is the prediction error corresponding to the last actual metrology and max ($|\epsilon_{-m}^T|$) is the maximum absolute prediction error among the last m wafers. When the prediction error is small, this control scheme favors the VM prediction. Other forms of $\alpha(\cdot)$ can also be incorporated that depend on variances of different predictors obtained in parallel. The third R2R control scheme can thus increase the smoothness of time adjustment, balance the impact of VM error compared to the first and second R2R control schemes, and adjust the weight automatically.

In Table 1 below, each of the three illustrative R2R control schemes according to embodiments of the invention are compared with one another in terms of standard deviations of the wafer thickness that those processes experimentally produce; the biases of these control schemes were negligible. Assume $\alpha=0.2$ in the second control scheme, Table 1 indicates that the standard deviation of the thicknesses for the third control scheme is the smallest compared to that for the other two cases. For all three processes, the standard deviations of the thicknesses obtained under R2R control are smaller than those without R2R control, thus demonstrating the superiority of the methods according to embodiments of the invention. More particularly, the case "without R2R control" represents a standard feedback control practice that is restricted to the availability of actual metrology values and conducted from lot to lot. This suggests the possibility for measurement rate reduction, given the current tolerance for process variation. In Table 1, the mean absolute prediction error is also shown, which influences the R2R control in VM applications.

TABLE 1

| σ | Process 1 | Process 2 | Process 3 |
|---|---|---|---|
| Without R2R Control | 64.16 | 79.95 | 88.15 |
| First Control Scheme | 58.04 | 66.11 | 68.98 |
|  | (−10%) | (−17%) | (−22%) |
| Second Control Scheme | 56.81 | 62.66 | 64.43 |
|  | (−11%) | (−22%) | (−27%) |
| Third Control Scheme | 57.81 | 64.89 | 63.59 |
|  | (−12%) | (−19%) | (−28%) |
| $\frac{\Sigma|y_i - \hat{y}_i|}{n}$ | 34.16 (T = 6250) | 38.32 (T = 6250) | 37.73 (T = 6250) |

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product, the computer program product in turn comprising a tangible computer readable storage medium storing in a non-transitory manner executable program instructions which, when executed, implement method steps according to an embodiment of the invention.

Figure 4:
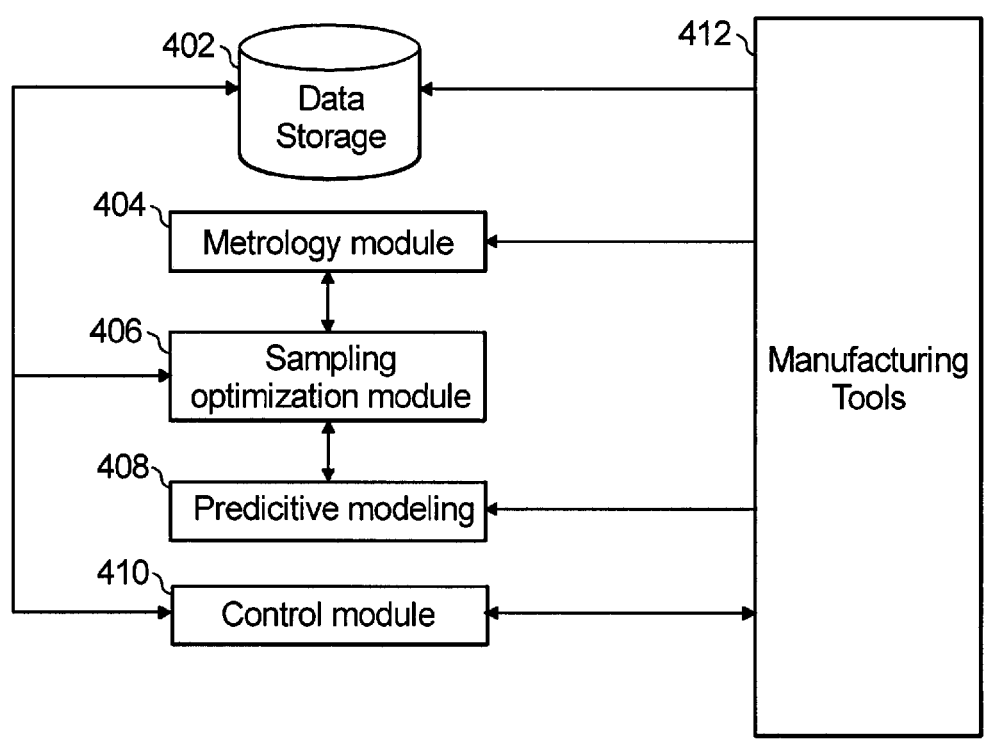
FIG. 4 is a block diagram depicting at least a portion of an exemplary system for R2R control and sampling optimization, according to an embodiment of the invention.

By way of illustration only, FIG. 4 is a block diagram depicting at least a portion of an exemplary system 400 for performing R2R control and sampling optimization, according to an embodiment of the invention. The R2R control system 400 includes a data storage unit 402, or alternative memory (e.g., embedded and/or standalone), a metrology module 404, a sampling optimization module 406, a predictive modeling module 408, and a control module 410. The R2R control system 400 receives prescribed information, including but not limited to actual metrology measurements, from manufacturing tools 412, which includes, for example, semiconductor processing equipment, metrology equipment, automated test equipment (ATE), etc.

Data storage unit 402 is operative to at least temporarily store certain information which may be used by the system 400, such as, for example, the results of actual measurements performed by the manufacturing tools 412 (e.g., wafer inspection), processing variables, etc., which may be used by one or more other modules in the system. The data storage unit 402 can be implemented, for example, as a database or alternative memory.

Metrology module 404 is essentially a device or apparatus operative to receive, from the manufacturing tools 412, one or more actual measured wafer parameters (e.g., oxide/film thickness, geometry, strength, etc.) and to generate an output that is indicative of actual measured wafer quality. For example, in one embodiment, metrology module 404 is operative to compare a measured process parameter (e.g., thickness of a deposited film) with a prescribed target value for that parameter (e.g., desired film thickness) and, based on how close the measured parameter is to the target value, generate the output indicative of wafer quality.

The predictive modeling module 408 is operative to receive prescribed information from the manufacturing tools 412, such as, for example, parameters indicating chamber capacity matching information, etc., and to generate therefrom a prediction model which, in one embodiment, is indicative of predicted wafer quality. Any one or more of the virtual metrology models discussed above are suitable for use with the predictive modeling module 408. The predictive modeling module 408 is operative to generate an output that is indicative of predicted wafer quality.

The sampling and optimization module 406 is operative to receive, among other parameters, the output indicative of actual measured wafer quality generated by the metrology module 404 and the output indicative of predicted wafer quality generated by the predictive modeling module 408, and is operative to generate an output adapted to optimize a sampling policy of the system 400. In one embodiment, optimizing the sampling policy comprises minimizing a sampling frequency of the system 400, although the invention is not limited to minimizing the sampling frequency. The sampling policy information generated by the sampling and optimization module 406 can be passed to the metrology module 404 for controlling the measurement of wafer parameters. A determination as to whether or not to measure individual wafers may also be generated by the sampling and optimization module 406 and provided to the metrology module 404.

The sampling and optimization module 406 is further operative to pass certain information to the predictive modeling module for controlling the model(s) upon which the wafer quality prediction is based to update (i.e., refresh) the model(s) and improve an accuracy thereof. In this regard, the sampling and optimization module 406 is operative to determine when a confidence in the virtual metrology (i.e., predictive model) has fallen below some prescribed target value so as to require taking actual metrology measurements to correct the predictive model. As an accuracy of the predictive model increases, a sampling frequency preferably decreases. A function of the sampling and optimization module 406 is therefore to minimize the sampling frequency.

By way of example only, consider a scenario in which the growth rate of oxide is monitored. While perhaps the most accurate approach may be to take actual measurements of oxide thickness on the wafers, such an approach is prohibitively costly and time consuming. A faster and less costly approach would be to rely on virtual metrology prediction results, but such results may not yield a desired level of accuracy. The sampling and optimization module 406, in this illustrative scenario, is operative to control a balance between a reliance on virtual metrology, comprising predictive modeling, and actual metrology to achieve a desired level of accuracy using a minimum sampling frequency (i.e., taking a minimal number of actual measurements).

The control module 410 is coupled with the manufacturing tools 412 and the sampling optimization module 406 in a feedback arrangement for controlling certain aspects of the manufacturing tools (e.g., processing parameters) for R2R control. More particularly, the control module 410 is operative to receive the sampling policy generated by the sampling and optimization module 406 and to control the manufacturing tools 412 in accordance with the sampling policy.

Figure 5:
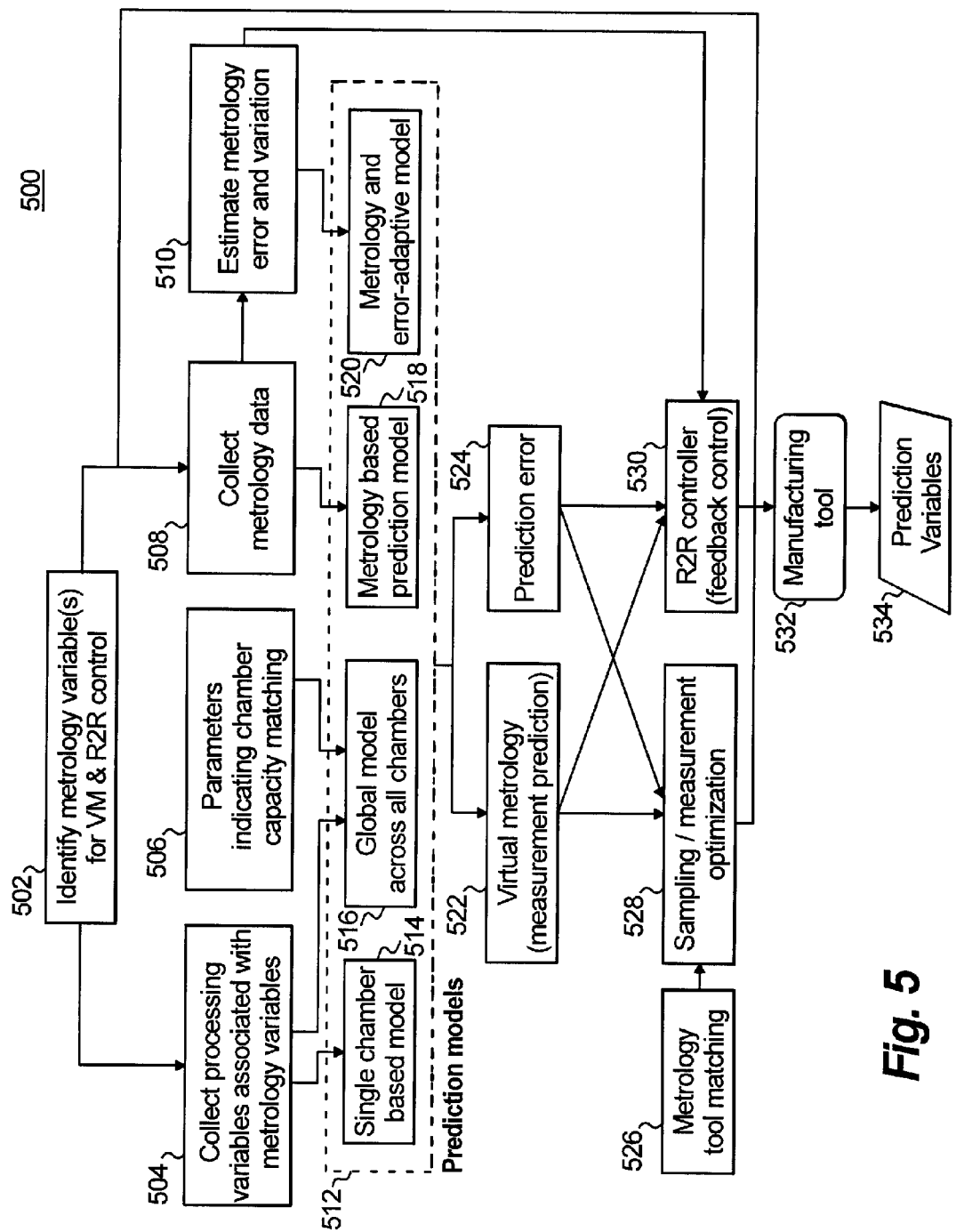
FIG. 5 is a flow diagram depicting at least a portion of an exemplary methodology for implementing the illustrative R2R control system shown in FIG. 4, according to embodiment of the invention.

FIG. 5 is a flow diagram depicting at least a portion of an exemplary methodology 500 for implementing the R2R control system 400 shown in FIG. 4, according to embodiment of the invention. In the description of method 500 below, the term "module" will be used to define a particular step or function. Although illustrated as being comprised of a plurality of functional modules for clarity purposes, it is to be appreciated that one or more modules, or portions thereof, may be combined and/or incorporated into one or more other modules, in accordance with aspects of the invention.

With reference to FIG. 5, in module 502, one or more metrology variables for VM and R2R control are identified. Metrology variables, which may be identified by a user and/or manufacturing or alternative tools (either manually or automated), may include, but are not limited to, process output parameters, such as, for example, film/oxide thickness, geometry, etc. At least a subset of the metrology variables are preferably provided to module 504 which is operative to collect processing variables associated with the received metrology variables. In module 506, parameters indicative of chamber capacity matching are collected for further processing. At least a subset of the metrology variables (either the same or a different subset as that received by module 504) are also provided to module 508, which is operative to collect metrology data associated with the received metrology variables. At least a portion of the metrology data is used by module 510 to estimate a metrology error and determine therefrom a deviation from prescribed target values.

The methodology 500 utilizes a plurality of prediction models 512, each prediction model being operative to generate an output result as a function of actual and/or virtual metrology data. In this illustrative embodiment, prediction models 512 includes four prediction models; namely, a single chamber based model 514, a global model across all (or multiple) chambers 516, a metrology based prediction model 518 and a metrology and error-adaptive model 520. The single chamber based model 514 is operative to receive processing variables from module 504 corresponding to one semiconductor processing chamber and construct a prediction model as a function thereof. The global model 516 is operative to receive parameters indicative of chamber capacity matching from module 506 and processing variables from module 504 corresponding to all, or at least a plurality, of the semiconductor processing chambers and to construct a prediction model as a function thereof. The metrology based prediction model 518 is operative to receive actual metrology measurement data from module 508 and variance curve information retrieved from a knowledge base or alternative storage element (e.g., storage unit 402 in FIG. 4) to build a prediction model based on the actual metrology measurement data and variance curve. The metrology and error-adaptive model 520 is operative to receive processing information from metrology tools (e.g., manufacturing tools 412 in FIG. 4) and metrology error and variation information from module 510, and to build a prediction model as a function thereof. Each of these prediction models is described in further detail herein above. For example, the single chamber based model 514 and global model 516 are expressed using equation (3) above; the metrology based prediction model 518 is expressed using equation (4); and the metrology and error-adaptive model 520 is expressed using equations (5) and (6). Results from one or more of the predictions models 514, 516, 518 and 520 are used by a virtual metrology module 522 to generate a measurement prediction output therefrom and are used by a prediction error module 524 to generate a prediction error output therefrom.

Method 500, in module 526, is operative to perform metrology tool matching. Results from module 526 are provided to a sampling/measurement optimization module 528. The sampling/measurement optimization module 528 is preferably operative in a manner consistent with the sampling and optimization module 406 shown in FIG. 4 and described above. More particularly, sampling/measurement optimization module 528 is operative to generate a sampling policy for controlling the collection of metrology data as a function of one or more of metrology tool matching results from module 526, measurement prediction results from virtual metrology module 522 and prediction error results from prediction error module 524. Accordingly, the sampling policy output generated by the sampling/measurement optimization module 528 is provided to module 508 to facilitate the collection of metrology data.

An R2R controller 530 is operative to receive measurement prediction results from virtual metrology module 522, prediction error results from prediction error module 524, and estimated metrology error and variation results from module 510. The R2R controller 530 is preferably operative in a manner consistent with the control module 410 shown in FIG. 4 and described above. Specifically, the R2R controller 530 is operative in a feedback control arrangement to control one or more manufacturing tools 532 in accordance with the sampling policy generated by the sampling/measurement optimization module 528. The manufacturing tools 532 are used to produce wafers and generate processing variables 534, which can be used by subsequent processing steps to adjust the manufacturing process to meet prescribed parameters.

Figure 6:
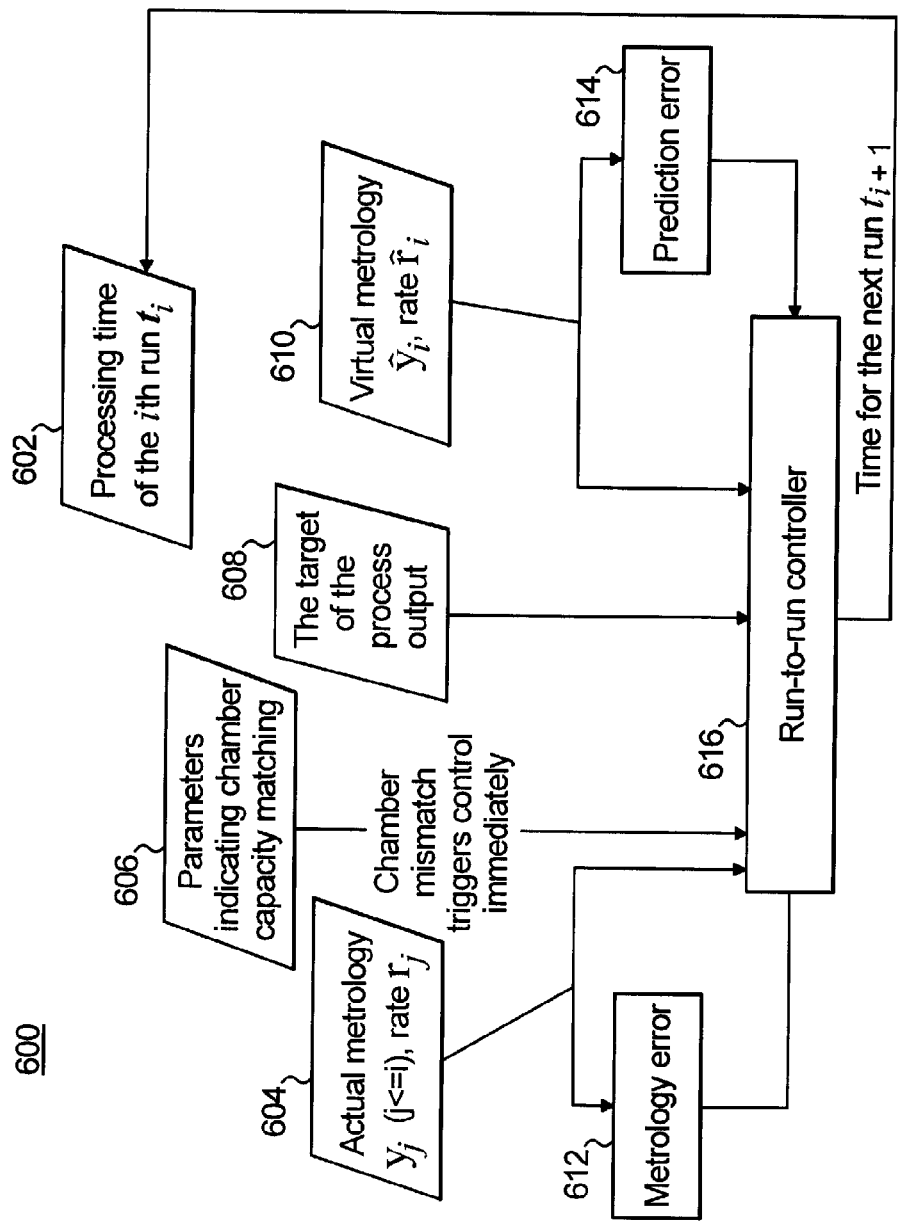
FIG. 6 is a flow diagram depicting at least a portion of an exemplary R2R control methodology, according to embodiment of the invention.

FIG. 6 is a flow diagram depicting at least a portion of an exemplary R2R control methodology 600, according to embodiment of the invention. The illustrative R2R control methodology 600 may be implemented, at least in part, in the control module 410 shown in FIG. 4. With reference to FIG. 6, in step 602, processing time of the $i^{th}$ run, $t_i$, is stored. This processing time is updated for subsequent runs. The processing time, in this embodiment, is used as an identified control parameter, although the invention is not limited to using processing time as a control parameter. Moreover, more than one control parameter may be employed, according to other embodiments.

In step 604, actual metrology measurements, $y_j$ and $r_j$ ($j \leq i$, i and j are integers), are obtained, where $y_i$ is indicative of a process parameter (e.g., deposition thickness) which may be used as a wafer quality metric, and $r_i$ is indicative of a rate of processing (e.g., deposition rate) corresponding to the $i^{th}$ wafer. For example, in accordance with equation (1) above, $y_i = \bar{r}_i t_i$, where $y_i$ is deposition thickness corresponding to the $i^{th}$ wafer, $\bar{r}_i$ is average deposition rate, and $t_i$ is deposition time. An output measured wafer parameter generated in Step 604 is provided to a R2R controller 616 whereby adjustments to the process can be performed as appropriate.

The actual measured wafer parameter is also used to determine metrology error in step 612 by comparing the actual measurement generated from the metrology in step 604 with an expected value for that wafer parameter. A discrepancy between the actual and expected results, taking in account a statistical accuracy of the metrology tools, is used to generate an output indicative of a confidence in the actual measurement. This output is provided to the R2R controller 616. Based on the amount of discrepancy between actual and expected results collected over time, an indication as to how to adjust the process variables.

In step 606, parameters indicating chamber capacity matching are obtained. These parameters represent factors relating to uncertainty and chamber capabilities. With regard to chamber capacity matching, a threshold is given for chamber capacity matching. If the difference of a particular chamber's capacity relative to other chambers is greater than the given threshold, the chamber processing parameters are adjusted to match its capacity to the other chambers. These chamber matching parameters are a subset of the parameters which may be used by the R2R controller 616 in determining a time, $t_{i+1}$, for the next processing run. A chamber mismatch triggers control immediately.

In step 608, a target, T, of the process output is obtained. The target, which is indicative of a desired value of the process output parameter, is provided to the R2R controller 616 and is used to control the parameters such as time for the subsequent run.

In step 610, a virtual metrology prediction model is generated based on parameters $\hat{y}_i$ and $\hat{r}_i$, where $\hat{y}_i$ is indicative of a predicted process parameter (e.g., deposition thickness) which may be used to output a prediction of $i^{th}$ wafer quality wafer, and $\hat{r}_i$ is indicative of a predicted rate of time (e.g., deposition rate) corresponding to the $i^{th}$ wafer. The predicted wafer quality output is provided to the R2R controller 616 and is also used to determine a prediction error in step 614. This prediction error output is provided to the R2R controller 616.

In accordance with principles of the invention, the R2R controller 616 is operative to receive the output from step 612 indicative of metrology error associated with the actual metrology and the output from step 614 indicative of prediction error associated with the virtual metrology, and to assign weights to the actual and virtual metrology results. The weight assigned to each of the actual and virtual metrology parameters is indicative of a statistical confidence in the respective parameters; a sum of the weights is equal to one. For example, a weight of 1.0 (100%) assigned to the actual metrology parameter and a weight of 0 (0%) assigned to the virtual metrology parameter indicates complete confidence in the actual metrology measurement and no confidence in the prediction model. Likewise, a weight of 0.8 (80%) assigned to the virtual metrology parameter and a weight of 0.2 (20%) assigned to the actual metrology parameter indicates a higher confidence in the prediction model compared with the actual metrology measurement; consequently, there is no need to take an actual measurement to update (i.e., correct) the prediction model.

The R2R controller 616 uses the assigned weights to generate a processing time, $t_{i+1}$, to be used in the next wafer run. Controller 616 is operative to dynamically adjust the weights assigned to the actual and virtual metrology parameters for each run as a function of prediction and metrology error. In this manner, the R2R controller 616 is beneficially able to optimize the sampling policy (e.g., minimizing sampling frequency) while maintaining a desired level of wafer quality or alternative process metric.

Consider an illustrative scenario in which $y_i$ is the deposition thickness of the wafer, $\bar{r}_i$ is the average deposition rate of the $i^{th}$ wafer, and $t_i$ is the deposition time of the $i^{th}$ wafer. In a first example representing R2R control in which actual and virtual metrology parameters are not used in combination, the deposition time, $t_{i+1}$, of the next wafer is determined as:

$$t_{i+1} = \frac{T}{\bar{r}_i}$$

where T is a target of $y_i$. In a second example utilizing both actual and virtual metrology results, the deposition time, $t_{i+1}$, of the next wafer is determined as:

$$t_{i+1} = \frac{T}{\alpha \bar{r}_{i,-1} + (1-\alpha)\hat{\bar{r}}_i},$$
$$0 \le \alpha \le 1$$

where $\alpha$ is an assigned weight. In a third example, factors other than actual and virtual metrology parameters, such as, but not limited to, uncertainty and chamber capabilities (e.g., chamber matching), are incorporated into the calculation of the deposition time, $t_{i+1}$, of the next wafer as follows:

$$t_{i+1} = \frac{T}{\alpha(\varepsilon)\bar{r}_{j,-1} + [1-\alpha(\varepsilon)]\hat{\bar{r}}_i},$$
$$0 \le \alpha(\varepsilon) \le 1,$$
$$j \le i$$

where $\alpha(\varepsilon)$ in this instance can be expressed as metrology variation $$\alpha(\varepsilon) = \frac{\text{var}(\hat{y})}{\text{var}(y_j) + \text{var}(\hat{y})}$$

or $$\alpha(\varepsilon) = \left(\frac{|\varepsilon_{-1}^T|}{\max(|\varepsilon_{-m}^T|)}\right)^2,$$

where $|\varepsilon_{-1}^T|$ is a prediction error corresponding to the last actual metrology and $\max(|\varepsilon_{-m}^T|)$ is a maximum absolute prediction error among the last m wafers.

Figure 7:
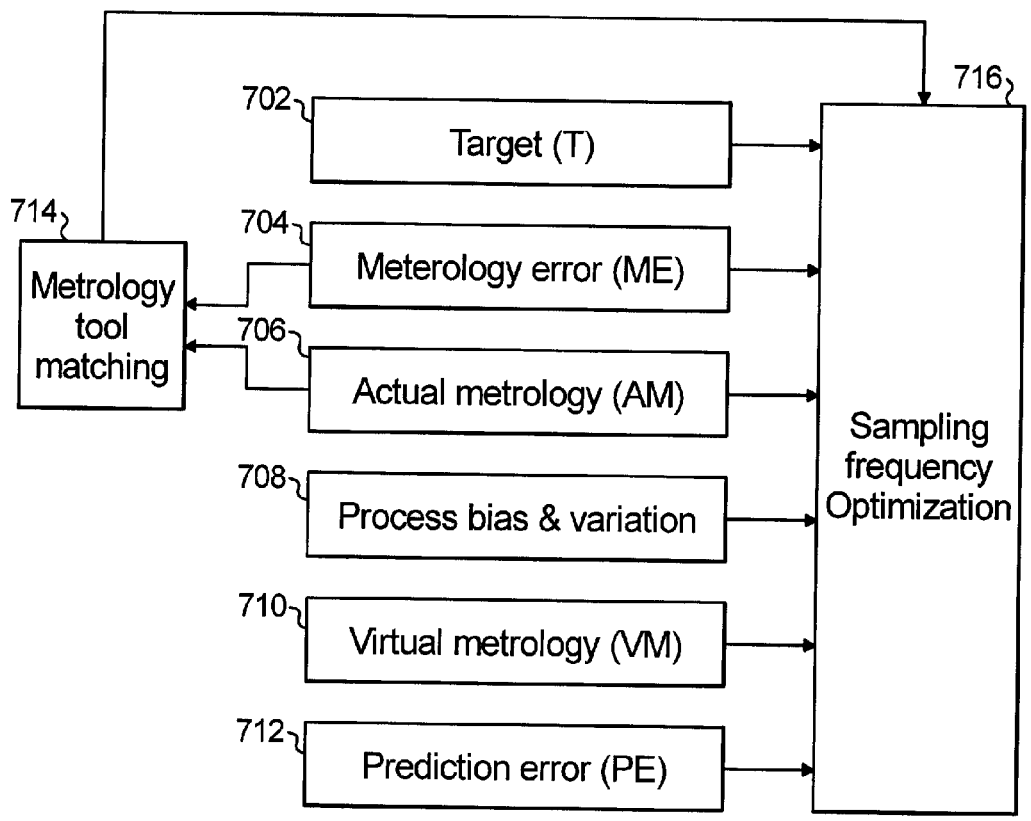
FIG. 7 is a flow diagram depicting at least a portion of an exemplary sampling policy optimization methodology, according to an embodiment of the invention.

FIG. 7 is a flow diagram depicting at least a portion of an exemplary sampling policy optimization methodology 700, according to an embodiment of the invention. The sampling policy optimization methodology 700 may be performed, for example, in the sampling optimization module 406 shown in FIG. 4. As apparent from FIG. 7, sampling policy optimization methodology 700 may utilize a plurality of factors, including, but not limited to, a process target T 702, a metrology error (ME) 704, an actual metrology (AM) 706, process bias and variation results 708, virtual metrology (VM) 710 and a prediction error (PE) 712. In this example, the sampling policy to be optimized is sampling frequency optimization 716, although the invention is not limited to optimization of sampling frequency.

One or more factors may influence one or more other factors. For example, actual metrology results 706 are used to estimate the metrology error 704 and/or process bias and variation factor 708. Likewise, a given factor may be a function of more than one other factor. For example, process bias and variation, in this illustration, can be estimated based on both actual metrology 706 and virtual metrology 710. Actual metrology 706 and metrology error 704 are used to estimate and control metrology tool matching 714. An output indicative of metrology tool matching 714 is provided to the sampling frequency optimization 716.

By way of example only and without loss of generality, consider a logic function to trigger different policies, f(ME, ME*, $C_{pk}$, C*, PE*, PE, T, AM, VM). A first exemplary policy may be expressed as $$SF = \frac{SF^*}{\beta_1(C_{pk}) + \beta_2(ME)},$$

where $C_{pk}$ and C* represent the process capability and its minimum allowed values in normal production, respectively, $\beta_1(C_{pk})$ represents normalized $C_{pk}$ and $\beta_2(ME)$ represents normalized metrology error. A second policy may be expressed as $$SF = SF^* \cdot \frac{\text{var}(VM)}{\text{var}(VM) + \text{var}(AM)},$$

where SF* represents minimum sampling frequency, and var(VM) and var(AM) represent the variance of the virtual metrology and actual metrology, respectively.

Assume an objective of the policy is to keep the measurement frequency at a minimum (SF*), for example, one out of eight lots and six wafers per sampled lot, when the following conditions are met:

metrology error (ME) is less than or equal to a prescribed minimum ME (ME≤ME), $C_{pk} \ge C^*$, and prediction error (PE) is less than or equal to a prescribed minimum PE (PE≤PE*);

actual metrology (AM) and virtual metrology (VM) are in-control (SPC); and metrology tool matching is within a prescribed tolerance. Otherwise, if the above conditions are not met, increase the sampling frequency to SF. For example, when metrology tool mismatch indicates high measurement variation/bias, more measurements need to be collected to compensate for the error.

A desired value, SF, for the sampling frequency can be determined from a dynamic function of factors, like tool matching parameters, variance of VM, metrology errors, etc., as described above. In one embodiment, a method for determining SF includes steps of:

After processing a given wafer, retrieve the processing variables and assess the following criteria:

$PE \leq PE^*$

Figure 8:
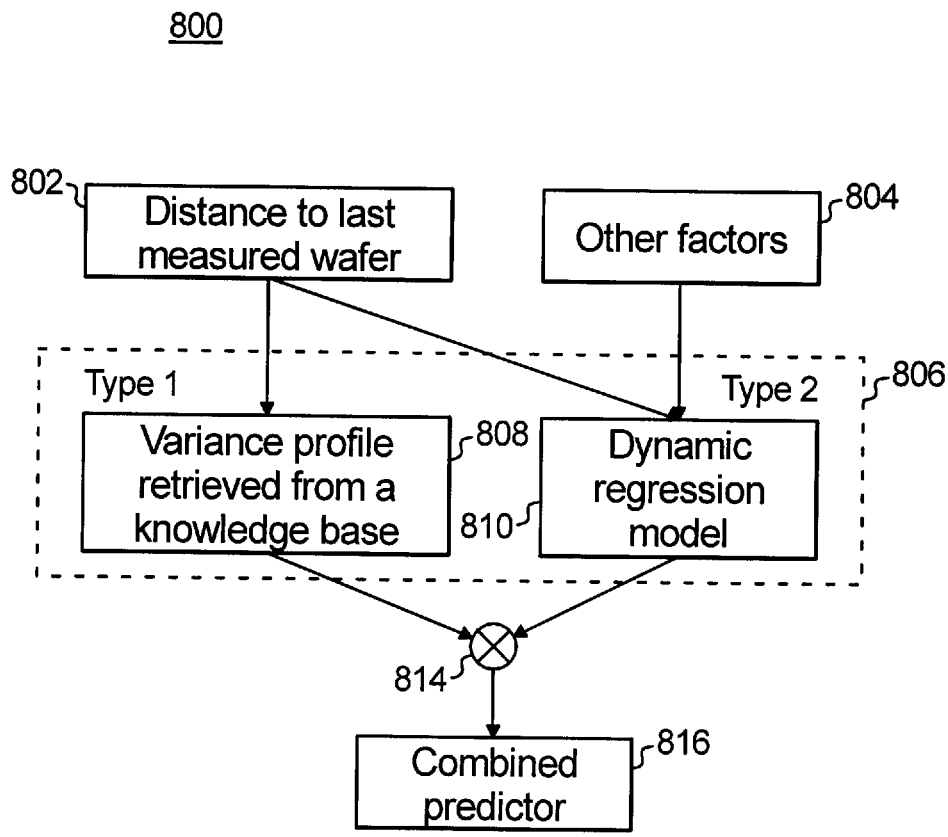
FIG. 8 is a flow diagram conceptually depicting at least a portion of an exemplary methodology for generating a metrology-based prediction model, according to an embodiment of the invention.

Workload of the metrology tools $C_{pk}$ based on the actual and virtual metrology $\geq C_{pk}^*$ Baseline measurement frequency established based on sampling frequency optimization If any criterion is violated, measure the wafer; else, compute a weighted criterion, C If $C > C^*$, measure the wafer; else, continue With reference now to FIG. 8, a flow diagram conceptually depicts at least a portion of an exemplary methodology 800 for generating a metrology-based prediction model, according to an embodiment of the invention. The methodology 800 is operative to receive various information, such as distance to the last measured wafer 802, which is indicative of the time since the last actual metrology was performed, and other factors 804 relating to the processing. The various information received may be referred to herein as predictors, since they are used in generating the metrology-based prediction model.

According to method 800, these received predictors are decomposed 806 into at least two types: namely, a first type (Type I) comprising variance profiles (e.g., the variance curve of deposition thickness over the number of wafers since the last measurement), and a second type (Type II). Weight components for Type I predictors 808 are pre-computable (e.g., based on equation (4A) and variance profile curves) and retrieved from a knowledge base (e.g., database) or alternative storage element. Type II predictors 810 are obtained based on dynamic regression models (e.g., equations (5) or (6)). Weight components for type II predictors are obtained based on regression-driven predictor variance estimates. At least a subset of the type I predictors 808 and at least a subset of the type II predictors 810 are combined 814 to generate, as an output of method 800, a combined predictor 816. Different weights indicative of a statistical confidence in the respective predictor types can be assigned to the type I and type II predictors (based on respective weight components), as previously described.

One or more embodiments of the invention, or elements thereof, can be implemented in the form of an apparatus including a memory and at least one processor that is coupled to the memory and operative to perform exemplary method steps.

In accordance with various embodiments, the methods, functions, and/or logic described herein are implemented as one or more software programs running on a computer processor. Dedicated hardware implementations including, but not limited to, application specific integrated circuits, programmable logic arrays and other hardware devices are configured to implement the methods described herein. Further, alternative software implementations including, but not limited to, distributed processing or component/object distributed processing, parallel processing, or virtual machine processing are configured to implement the methods, functions, or logic described herein.

The embodiment contemplates a machine-readable medium or computer-readable medium containing instructions, or that which receives and executes instructions from a propagated signal so that a device connected to a network can send or receive voice, video or data, and to communicate over the network using the instructions. The instructions may be further transmitted or received over a network via a network interface device(s). The machine-readable medium also contains a data structure for storing data useful in providing a functional relationship between the data and a machine or computer in an illustrative embodiment of the systems and methods herein.

While the machine-readable medium may be embodied in a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform anyone or more of the methodologies of the embodiment. The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and/or a digital file attachment to e-mail or other self-contained information archive or set of archives is considered a distribution medium equivalent to a tangible storage medium. Accordingly, the embodiment is considered to include anyone or more of a tangible machine-readable medium or a tangible distribution medium, as listed herein and including art-recognized equivalents and successor media, in which the software implementations herein are stored.

It should also be noted that software, which implements the methods, functions or logic herein, are optionally stored on a tangible storage medium, such as: a magnetic medium, such as a disk or tape; a magneto-optical or optical medium, such as a disk; or a solid state medium, such as a memory card or other package that houses one or more read-only (non-volatile) memories, random access memories, or other re-writable (volatile) memories. A digital file attachment to e-mail or other self-contained information archive or set of archives is considered a distribution medium equivalent to a tangible storage medium. Accordingly, the disclosure is considered to include a tangible storage medium or distribution medium as listed herein and other equivalents and successor media, in which the software implementations herein are stored.

The illustrations of embodiments of the invention described herein are intended to provide a general understanding of the structure of the various embodiments, and they are not intended to serve as a complete description of all the elements and features of apparatus and systems that might make use of the structures described herein. Many other embodiments will become apparent to those of skill in the art upon reviewing the above description. Other embodiments are utilized and derived therefrom, such that structural and logical substitutions and changes are made without departing from the scope of this disclosure. Figures are also merely representational and are not necessarily drawn to scale. Certain proportions thereof may be exaggerated, while others diminished in order to facilitate an explanation of the embodiments of the invention. Accordingly, the specification and drawings are to be regarded in an illustrative rather than a restrictive sense.

Such embodiments of the inventive subject matter are referred to herein, individually and/or collectively, by the term "embodiment" merely for convenience and without intending to voluntarily limit the scope of this application to any single embodiment or inventive concept if more than one is in fact shown. Thus, although specific embodiments have been illustrated and described herein, it should be appreciated that any arrangement calculated to achieve the same purpose are substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single embodiment. Thus the following claims are hereby incorporated into the Detailed Description, with each claim standing on its own as a separate example embodiment.

The Abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single embodiment. Thus the following claims are hereby incorporated into the Detailed Description, with each claim standing on its own as separately claimed subject matter.

Although specific example embodiments have been described, it will be evident that various modifications and changes are made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter are practiced. The embodiments illustrated are described in sufficient detail to enable those skilled in the art to practice the teachings herein. Other embodiments are utilized and derived therefrom, such that structural and logical substitutions and changes are made without departing from the scope of this disclosure. This Detailed Description, therefore, is not to be taken in a limiting sense, and the scope of various embodiments is defined only by the appended claims, along with the full range of equivalents to which such claims are entitled.

Given the teachings of the invention provided herein, one of ordinary skill in the art will be able to contemplate other implementations and applications of the techniques of the invention. Although illustrative embodiments of the invention have been described herein with reference to the accompanying drawings, it is to be understood that the invention is not limited to those precise embodiments, and that various other changes and modifications are made therein by one skilled in the art without departing from the scope of the appended claims.

What is claimed is:

1. A method for run-to-run control and sampling optimization in a semiconductor manufacturing process, the method comprising steps of:
   determining a process output and corresponding metrology error associated with an actual metrology for a current processing run in the semiconductor manufacturing process;
   determining a predicted process output and corresponding prediction error associated with a virtual metrology for the current semiconductor manufacturing processing run;
   assigning a first weight to the metrology error and a second weight to the prediction error, the first and second weights being indicative of a confidence in the metrology error and prediction error, respectively; and
   controlling at least one parameter corresponding to a subsequent semiconductor manufacturing processing run as a function of the metrology error, the first and second weights, and the prediction error;
   wherein said semiconductor manufacturing process is executed to fabricate at least one wafer.

2. The method of claim 1, wherein the steps of determining the process output and corresponding metrology error comprises:
   measuring at least one target processing parameter corresponding to a wafer fabricated in the current processing run;
   comparing the measured at least one target processing parameter with an expected value for the at least one target processing parameter; and
   determining the metrology error as a function of a variation between the measured at least one target processing parameter and the expected value for the at least one target processing parameter.

3. The method of claim 1, wherein the steps of determining the predicted process output and corresponding prediction error comprises:
   obtaining a prediction model associated with the semiconductor manufacturing process, the prediction model adapted to predict the process output by estimating at least one processing parameter for the semiconductor manufacturing process; and
   performing virtual metrology based on the prediction model, the prediction error being determined as a function of an output of the virtual metrology.

4. The method of claim 3, wherein the prediction model comprises at least one of a single processing chamber based model, a global model across a plurality of processing chambers, a metrology-based prediction model, and a metrology and error-adaptive model.

5. The method of claim 4, wherein the global model is generated by approximating coefficients corresponding to different processing chambers to a common vector given by prior information on tool capability matching, adding a positive coefficient to balance different terms in the global model, and minimizing the prediction error and optimizing the approximation.

6. The method of claim 5, wherein optimizing the approximation comprises using a block coordinate based algorithm.

7. The method of claim 4, further comprising constructing the metrology-based prediction model by:

obtaining a plurality of predictors, the predictors comprising information relating to the semiconductor manufacturing process;

decomposing the predictors into at least two types, a first type comprising variance profiles, and a second type obtained based on dynamic regression models; and generating a combined predictor comprising at least a subset of the first type of predictors and at least a subset of the second type of predictors.

8. The method of claim 1, wherein the first and second weights are dynamically adjusted in accordance with a confidence in the metrology error and prediction error, respectively, over time.

9. The method of claim 1, wherein each of the first and second weights is a percentage, with a sum of the first and second weights being equal to one.

10. The method of claim 1, further comprising optimizing a sampling policy corresponding to the semiconductor manufacturing process as a function of the first and second weights.

11. The method of claim 10, wherein the step of optimizing the sampling policy comprises maximizing a time between actual metrology measurements obtained in connection with the semiconductor manufacturing process.

12. The method of claim 1, wherein respective values of the first and second weights are determined as a function of one or more factors related to uncertainty and chamber matching capabilities associated with the semiconductor manufacturing process.

13. A method for run-to-run control and sampling optimization in a semiconductor manufacturing process, the method comprising steps of:

determining a process output and corresponding metrology error associated with an actual metrology for a current processing run in the semiconductor manufacturing process;

determining a predicted process output and corresponding prediction error associated with a virtual metrology for the current semiconductor manufacturing processing run; and controlling at least one parameter corresponding to a subsequent semiconductor manufacturing processing run as a function of the metrology error and the prediction error;

wherein the steps of determining the predicted process output and corresponding prediction error comprises:

obtaining a prediction model associated with the semiconductor manufacturing process, the prediction model adapted to predict the process output by estimating at least one processing parameter for the semiconductor manufacturing process; and performing virtual metrology based on the prediction model, the prediction error being determined as a function of an output of the virtual metrology;

wherein the prediction model comprises a wafer quality prediction model for metrology variable prediction which utilizes tensor input process variables by directly operating on the tensor input process variables.

14. A method for run-to-run control and sampling optimization in a semiconductor manufacturing process, the method comprising steps of:

determining a process output and corresponding metrology error associated with an actual metrology for a current processing run in the semiconductor manufacturing process;

determining a predicted process output and corresponding prediction error associated with a virtual metrology for the current semiconductor manufacturing processing run;

controlling at least one parameter corresponding to a subsequent semiconductor manufacturing processing run as a function of the metrology error and the prediction error;

assigning a first weight to the metrology error and a second weight to the prediction error, the first and second weights being indicative of a confidence in the metrology error and prediction error, respectively;

controlling the at least one parameter corresponding to a subsequent processing run as a function of the first and second weights; and optimizing a sampling policy corresponding to the semiconductor manufacturing process as a function of the first and second weights;

wherein the step of optimizing the sampling policy comprises at least one of: minimizing a sampling frequency of the semiconductor manufacturing process, the sampling frequency being indicative of at least one of a number of processing runs and a number of wafers between consecutive metrology measurements obtained during actual metrology; and maximizing a time between actual metrology measurements obtained in connection with the semiconductor manufacturing process.

15. A method for run-to-run control and sampling optimization in a semiconductor manufacturing process, the method comprising steps of:

determining a process output and corresponding metrology error associated with an actual metrology for a current processing run in the semiconductor manufacturing process;

determining a predicted process output and corresponding prediction error associated with a virtual metrology for the current semiconductor manufacturing processing run;

controlling at least one parameter corresponding to a subsequent semiconductor manufacturing processing run as a function of the metrology error and the prediction error;

assigning a first weight to the metrology error and a second weight to the prediction error, the first and second weights being indicative of a confidence in the metrology error and prediction error, respectively;

controlling the at least one parameter corresponding to a subsequent processing run as a function of the first and second weights; and calculating a given one of the first and second weights according to an expression $$\alpha(\varepsilon) = \left[\frac{|\varepsilon_{-1}^T|}{\max(|\varepsilon_{-m}^T|)}\right]^2,$$

where $\alpha(\varepsilon)$ represents the given one of the first and second weights, $\varepsilon_{-1}^T$ represents a prediction error corresponding to a most recent actual metrology, and max ($|\varepsilon_{-m}^T|$) represents maximum absolute prediction error among the last m wafers, m being an integer.

16. A method for run-to-run control and sampling optimization in a semiconductor manufacturing process, the method comprising steps of:

determining a process output and corresponding metrology error associated with an actual metrology for a current processing run in the semiconductor manufacturing process;

determining a predicted process output and corresponding prediction error associated with a virtual metrology for the current processing run; and controlling at least one parameter corresponding to a subsequent processing run as a function of the metrology error and the prediction error;

wherein determining the predicted process output and corresponding prediction error comprises: obtaining a prediction model associated with the semiconductor manufacturing process, the prediction model adapted to predict the process output by estimating at least one processing parameter for the semiconductor manufacturing process, the prediction model comprising a wafer quality prediction model for metrology variable prediction which utilizes tensor input process variables; and performing virtual metrology based on the prediction model, the prediction error being determined as a function of an output of the virtual metrology.

17. A method for run-to-run control and sampling optimization in a semiconductor manufacturing process, the method comprising steps of:

determining a process output and corresponding metrology error associated with an actual metrology for a current processing run in the semiconductor manufacturing process;

determining a predicted process output and corresponding prediction error associated with a virtual metrology for the current processing run;

controlling at least one parameter corresponding to a subsequent processing run as a function of the metrology error and the prediction error;

assigning a first weight to the metrology error and a second weight to the prediction error, the first and second weights being indicative of a confidence in the metrology error and prediction error, respectively;

controlling the at least one parameter corresponding to a subsequent processing run as a function of the first and second weights; and optimizing a sampling policy corresponding to the semiconductor manufacturing process as a function of the first and second weights;

wherein optimizing the sampling policy comprises at least one of: minimizing a sampling frequency of the semiconductor manufacturing process, the sampling frequency being indicative of at least one of a number of processing runs and a number of wafers between consecutive metrology measurements obtained during actual metrology; and maximizing a time between actual metrology measurements obtained in connection with the semiconductor manufacturing process.

* * * * *